United States Patent [19]

Gardner

[11] Patent Number: 5,444,022
[45] Date of Patent: Aug. 22, 1995

[54] METHOD OF FABRICATING AN INTERCONNECTION STRUCTURE FOR AN INTEGRATED CIRCUIT

[75] Inventor: Donald S. Gardner, Mountain View, Calif.

[73] Assignee: Intel Corporation, Santa Clara, Calif.

[21] Appl. No.: 175,053

[22] Filed: Dec. 29, 1993

[51] Int. Cl.⁶ .................... H01L 21/44; H01L 21/48
[52] U.S. Cl. .................... 437/195; 437/192; 437/194; 437/228
[58] Field of Search ............... 437/195, 192, 189–190, 437/194, 197

[56] References Cited

U.S. PATENT DOCUMENTS

| | | | |
|---|---|---|---|
| 4,507,852 | 4/1985 | Karulkar | 437/195 |
| 4,714,686 | 12/1987 | Sander et al. | 437/195 |
| 4,879,257 | 11/1989 | Patrich | 437/195 |
| 5,106,461 | 4/1992 | Volfson et al. | 437/195 |

OTHER PUBLICATIONS

Weide, K. et al., 3-Dimensional Simulations of Temperature and Current Density Distribution in a Via Structure, *IEEE/IRPS*, pp. 361–365, (Jan. 1992).

Totta, Paul A., Stress Induced Phenomena in Metallizations: U.S. Perspective, *American Institute of Physics*, pp. 1–20. (1992).

Gardner, D. et al., Layered and Homogenous Films of Aluminum and Aluminum/Silicon with Titanitum, Zirconium, and Tungsten for Multilevel Interconnects, *IEDM* 84, pp. 114–117 (1984).

Gardner, D. et al., Interconnection and Electromigration Scaling Theory, *IEEE Transactions on Electron Devices*, vol. ED-34, No. 3, pp. 632–643, (Mar. 1987).

Primary Examiner—Olik Chaudhuri
Assistant Examiner—H. Jey Tsai
Attorney, Agent, or Firm—Blakely, Sokoloff, Taylor & Zafman

[57] ABSTRACT

A novel, high performance, high reliability interconnection structure for an integrated circuit. The interconnection structure of the present invention is formed on a first insulating layer which in turn is formed on a silicon substrate or well. A first multilayer interconnection comprising a first aluminum layer, a first refractory metal layer, and a second aluminum layer is formed on the first insulating layer. A second insulating layer is formed over the first multilayer interconnection. A conductive via is formed through the second insulating layer and into the multilayer interconnection wherein a portion of the via extends above the second insulating layer. A second interconnection is formed on the second insulating layer and on and around the portion of the via extending above the second insulating layer.

9 Claims, 5 Drawing Sheets

METHOD OF FABRICATING AN INTERCONNECTION STRUCTURE FOR AN INTEGRATED CIRCUIT

BACKGROUND OF THE INVENTION

1. Field of the Invention

The present invention relates to the field of multilevel integrated circuits, and more specifically, to the field of ULSI multilevel interconnection structures.

2. Discussion of Related Art

Modern integrated circuits are made up of literally millions of active devices such as transistors and capacitors. These devices are initially isolated from one another but are later interconnected together to formed functional circuits. The quality of the interconnection structure drastically affects the performance and reliability of the fabricated circuit. Interconnections are increasingly determining the limits of performance and density of modern ultra large scale integrated (ULSI) circuits.

FIG. 1 is a cross-sectional illustration of an interconnection structure which is presently used in the semiconductor industry. Formed in a silicon substrate or well 102 are active devices (not shown) such as transistors and capacitors. Interconnection lines 104 and 106, which are typically aluminum or aluminum alloys, are used to couple active devices into functional circuits. Metal interconnections 104 and 106 and substrate 102 are electrically isolated from one another by interlevel dielectric's (ILDs) 108 and 110, respectively. Electrical connections are made between metal interconnections 104 and 106 through the use of metal vias 112.

The interconnection structure of FIG. 1 experiences several problems. As integrated circuit dimensions decrease, in order to increase circuit density and complexity, vias are becoming smaller by the square of the dimension decrease. Such small vias can cause both reliability and performance problems in a fabricated integrated circuit. Reliability problems are caused by high concentrations of current or current crowding at the corners 114 of via 112, as shown in FIG. 1. Current crowding in area 114 can cause self-heating effects which can cause electromigration. Electromigration can cause voids and open circuits and other reliability problems. Performance of small dimensioned vias is decreased due to an increase in contact resistance caused by a reduction of the interfacial contact area between via and interconnections. It is to be appreciated that contact resistance is becoming the major portion of the total interconnection resistance.

Another problem with the interconnection structure of FIG. 1 is the aluminum metal used for interconnections 104 and 106. Aluminum interconnections are known to suffer from electromigration. Electromigration in interconnections are known to cause voids which can cause open circuits and failures. Aluminum interconnections are also known to form hillocks which can result in nonplanar interconnection structures and can cause interlevel shorts with interconnections formed above and intralevel shorts with neighboring interconnection lines from the same level of metalization. These problems are magnified as line widths decrease and packing densities increase as in the case of future ULSI circuits.

Thus, what is desired is a ULSI compatible interconnection structure which exhibits excellent performance and reliability.

SUMMARY OF THE INVENTION

A novel, high performance, high reliability, high density, ULSI manufacturable, multilevel interconnection structure is described. The interconnection structure of the present invention is formed on a first insulating layer of an integrated circuit. A first multilayer interconnection comprising a first aluminum layer, a first refractory metal layer, and a second aluminum layer is formed on the first insulating layer. A second insulating layer is formed over the first multilayer interconnection. A conductive via of, for example, tungsten, aluminum, copper or TiN, is formed through the second insulating layer and into the multilayer interconnection wherein the via is formed down to at least the first refractory metal layer of the multilayer interconnection to form a high surface area contact with the first multilayer interconnection. A portion of the conductive via extends above the second insulating layer so that a high surface area contact can be made to a second interconnection which is formed on the second insulating layer and on and around the portion of the via extending above the second insulating layer.

A goal of the present invention is to form an interconnection structure which exhibits excellent performance and reliability even when formed to the small dimensions necessary for modern ULSI circuits.

Another goal of the present invention is to provide an interconnection structure which provides decreased current crowding around vias.

Still another goal of the present invention is to provide an interconnection structure which exhibits redundant current carrying capabilities.

Still yet another goal of the present invention is to provide an interconnection structure which is resistant to electromigration and related failures.

Still other goals and advantages of the present invention will become obvious from the detailed description of the present invention which follows.

BRIEF DESCRIPTION OF THE DRAWINGS

FIG. 3b is an illustration of a cross-sectional view showing the formation of a multilayer interconnection, an insulating layer and a sacrificial layer on the substrate of FIG. 3a.

DETAILED DESCRIPTION OF THE PRESENT INVENTION

The present invention describes a novel, high density, high reliability, high performance interconnection structure with a ULSI manufacturable process. In the following description numerous specific details are set forth such as materials thicknesses and types in order to provide a thorough understanding of the present invention. It will be obvious, however, to one skilled in the art that the present invention may be practiced without these specific details. In other instances, well-known semiconductor manufacturing processes and equipment have not been set forth in detail in order to not unnecessarily obscure the present invention.

Figure 1:
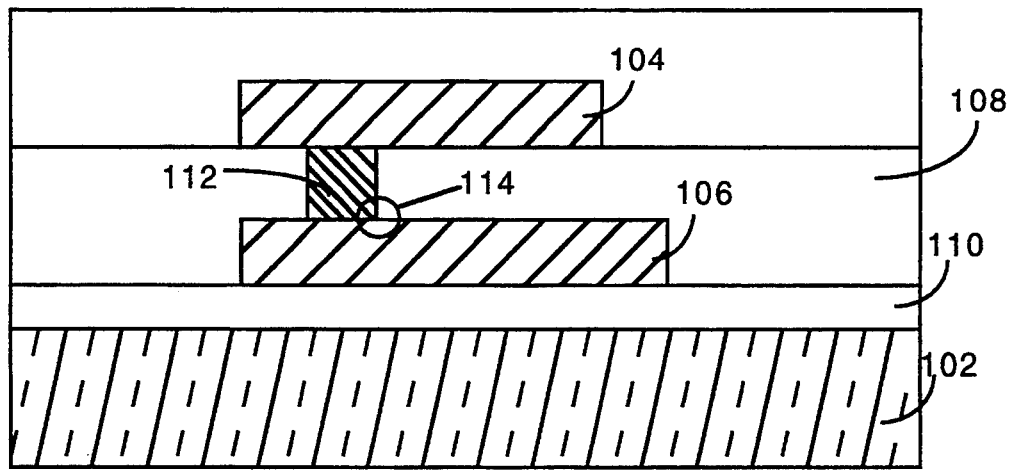
FIG. 1 is an illustration of a cross-sectional view of a prior art interconnection structure.
Figure 2:
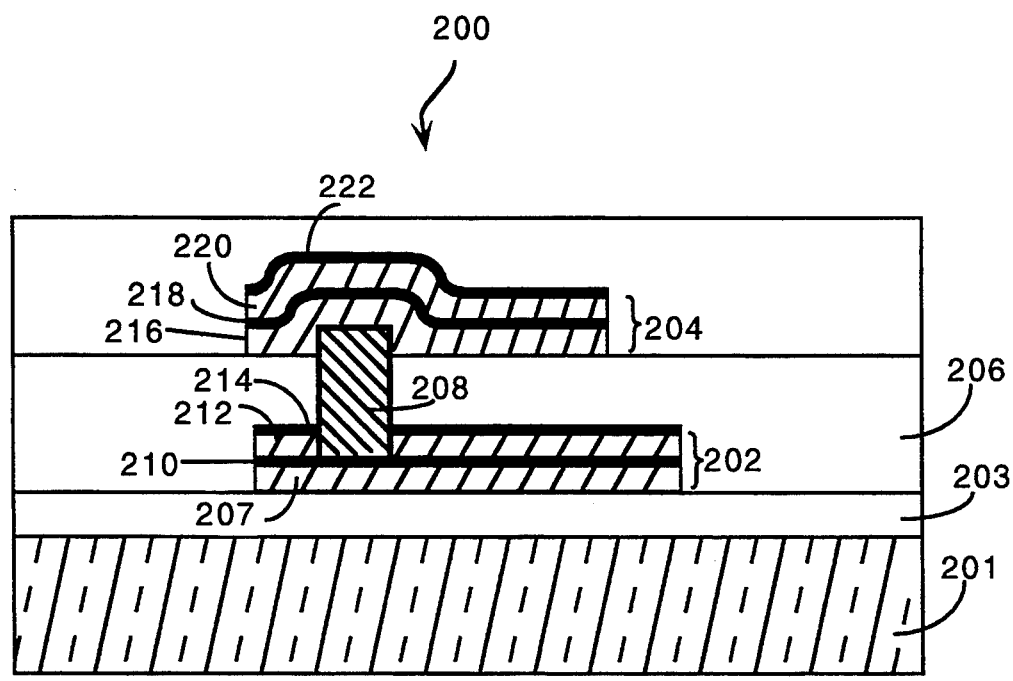
FIG. 2 is an illustration of a cross-sectional view of the novel interconnection structure of the present invention utilizing high surface area vias and electromigration resistant multilayer interconnections.

The preferred embodiment of the present invention is shown in FIG. 2. The present invention is a multilevel interconnection structure 200 which is ideal for high density, high reliability, and high performance integrated circuits. Interconnection structure 200 comprises interconnections 202 and 204. Interconnection structure 200 is formed on an interlayer dielectric 203 which in turn is formed on a silicon substrate or well 201. In the preferred embodiment interconnections 202 and 204 are multilayer interconnections. Multilayer interconnections 202 and 204 are electrically isolated from one another by an interlayer dielectric (ILD) 206 such as $SiO_2$. Multilayer interconnection 202 comprises a first aluminum-copper alloy layer 207, a first refractory metal layer 210, such as titanium, a second aluminum-copper alloy layer 212, and a second refractory metal layer 21 4. Multilayer interconnection 204 has a similar structure, comprising a first aluminum-copper alloy layer 216, a first refractory metal layer 218, a second aluminum-copper alloy layer 220, and a second refractory metal layer 222. High surface area via 208 couples multilayer interconnection 202 to multilayer interconnection 204. Via 208 is formed through ILD 206, and through second refractory metal layer 21 4 and second aluminum copper-alloy layer 212 to first refractory metal layer 210 of multilayer interconnection 202. Additionally, in the preferred embodiment a portion of via 208 extends above ILD 206 and interconnection 204 is formed over and around the portion of via 208 which extends above ILD 206. In this way via 208 has a high surface area contact to both interconnection 204 and 202.

An important feature of the present invention is the use of high surface area vias. In the preferred embodiment of the present invention high surface area contacts are made between via 208 and interconnections 202 and 204. By using a high surface area via, both the performance and reliability of the interconnection structure 200 are improved. For example, since via 208 is formed through metal layers 214 and 212, and is in contact with refractory metal layer 210, the interfacial contact area between via 208 and multilayer interconnection 202 is much larger than with traditional vias. That is, via 208 has a much larger area in contact with multilayer interconnection 202 than it would have if a traditional via were utilized. For example, when a circular via is utilized, the interfacial contact area is increased from:

$$a = \pi r^2$$

to: $$a = \pi r^2 + 2\pi rd$$

where r is the radius of the via 208 and d is the depth at which via 208 is recessed into interconnection 202. The change in geometry results in both improved reliability and an increase in circuit performance (speed). The higher surface area contact decreases the resistance of the contact (which improves performance) because contact resistance itself is a substantial source of the total resistance of the interconnection. Reliability is improved in the present invention because the high surface area contacts result in less current crowding around the corners of via 208. Less current crowding decreases the peak current densities. A decrease in peak current density decreases the potential for electromigration in via 208 and therefore improves the reliability of interconnection structure 200. It is to be noted that via 208 in the preferred embodiment has vertical sidewalls allowing for high density packing of vias which will be required for future ultra large scale integrated (ULSI) circuits.

Although standard single layer aluminum interconnections can be used in the present invention, multilayer interconnections are preferred. Multilayer interconnections provide several advantages for interconnection structure 200. Multilayer interconnections 202 and 204 provided improved electromigration resistance because they comprise aluminum-refractory metal layer stacks. It is to be appreciated that refractory metals, such as titanium (Ti), tungsten (W), and molybdenum (Mo), and refractory metal compounds such as TiN are highly electromigration-resistant metals. Refractory metal layers 210 and 218 prevent voids from forming completely through multilayer interconnections 202 and 204. If a void forms in one aluminum layer it will not extend into the other aluminum layer because the refractory metal layer "sandwiched" between the two aluminum layers prevents its expansion. Refractory metal capping layers 214 and 222 deposited onto second aluminum alloy layers 212 and 220, respectively, help suppress hillock formation, which as mentioned earlier, can cause both intralevel and interlevel shorts. Hillocks can also cause non-planar interconnection levels which can cause downstream manufacturing problems.

Another advantage with the use of multilayer interconnections 202 and 204 of the present invention is that they provide redundant current paths. That is, if a void forms in one aluminum layer then current can bypass the void by flowing through other layers. It is to be appreciated, however, that if standard vias were utilized, this redundancy would be lost around the vias. The problem is that the metal layers are generally parallel to the surface of an integrated circuit, so that when a via is reached, current has to change direction and traverse perpendicular to the surface. Thus, if standard vias were utilized, all current from both aluminum layers of an interconnect would have to pass through the area directly beneath or above the via. Such a high current density in these areas can cause void formation.

If a void formed either in the area directly above or below a standard via contact the device would fail because there is no alternative current path to the via. Thus by using high surface area via 208, redundancy is preserved in the present invention. In interconnection structure 200 all current does not flow through one area of the multilayer interconnections. In the preferred embodiment of the present invention both interconnections 202 and 204 provide multiple current paths to via 208 making the interconnection structure highly reliable.

Although aluminum alloy-refractory metal "sandwiches" are preferred in the present invention, other electromigration resistant structures may be utilized to form a high reliability interconnection structure. For example, a refractory metal such as Ti can be formed first to help improve adhesion and help reduce electromigration. Additionally, metals such as Ti or TiN can be used as the main current carrying conductor in place of aluminum. What is important is to provide an electromigration resistant material in the interconnection to help prevent electromigration and to preserve redundancy.

It is to be noted that although tungsten is the preferred material for via filling in the present invention, aluminum, copper, TiN or polysilicon vias can be utilized. Aluminum vias are not normally used in modern integrated circuits because of their electromigration problems. However, because high surface area vias are utilized in the present invention, electromigration problems for aluminum vias are reduced. Thus, the interconnection structure of the present invention allows the use of aluminum vias. That is, by using high surface area vias recessed into the interconnection line below, aluminum vias can be reliably used. It is to be appreciated that because aluminum has a lower resistivity than tungsten, aluminum vias are better performing than are tungsten vias. Additionally, aluminum vias may be more reliable than tungsten vias if aluminum interconnections are used.

Figure 3A:
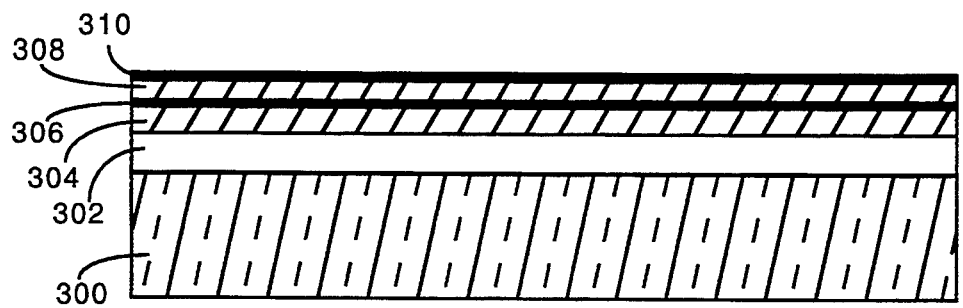
FIG. 3a is an illustration of a cross-sectional view of a silicon substrate having an insulating layer formed upon it, a first aluminum alloy layer formed upon the insulating layer, a first refractory metal layer formed upon the first aluminum alloy layer, a second aluminum alloy layer formed upon the first refractory metal layer, and a second refractory metal layer formed upon the second aluminum alloy layer.

In fabrication of the preferred embodiment of the interconnection structure of the present invention, an interlevel dielectric (ILD) 302, such as $SiO_2$, is formed on a silicon substrate or well 300, as shown in FIG. 3a. Active devices such as transistors and capacitors (not shown), have been previously formed in substrate 300. Next, a first aluminum or aluminum alloy layer 304, such as aluminum with 0.5% by weight of copper is formed on ILD 302. The aluminum alloy layer 304 is formed to a thickness of between 2000–6000Å. The first aluminum alloy layer 304 can be formed with well-known sputtering techniques. Next, a first refractory metal layer 306 is formed on the first aluminum alloy layer. In the preferred embodiment of the present invention the first refractory metal layer 306 is titanium formed to a thickness of between 100–500Å with well-known sputtering techniques. It is to be appreciated that other refractory metals such as Tungsten (W) and Molybdenum (Mo), Tantalum (Ta), and Niobium (Nb), and refractory metal compounds such as Titanium-nitride (TIN) and Titanium-tungsten (TiW) may be used as refractory metal layer 306. Next, a second aluminum or aluminum alloy layer 308 is deposited on the first refractory metal layer 306. Second aluminum alloy layer 308 can be formed with well-known sputtering techniques to a thickness of between 2000–6000Å. Next, a second refractory metal layer 310 is deposited onto the second aluminum alloy layer 308. The second refractory metal layer in the preferred embodiment is titanium. It is to be appreciated that deposition of layers 304, 306, 308 and 310 can be done in the same system without breaking vacuum. It is also to be appreciated that although only two aluminum-refractory metal "sandwiches" are used in the present invention, additional aluminum-refractory metal layers may also be used.

Figure 3B:
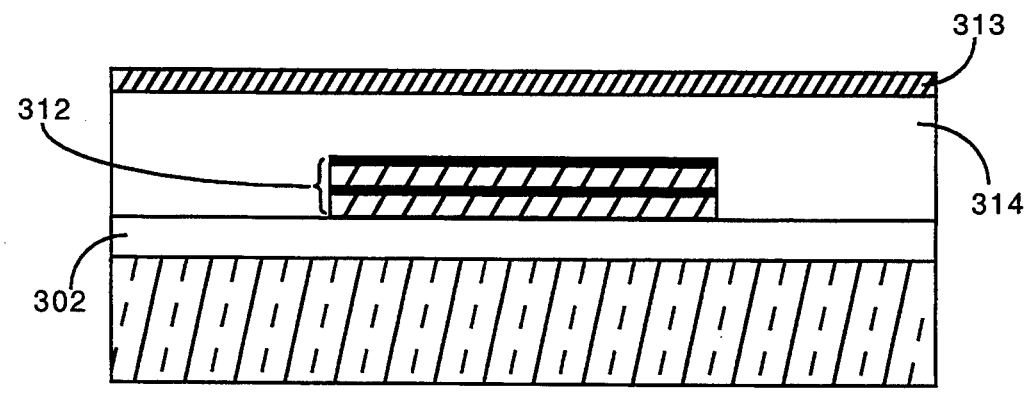

In reference to FIG. 3b, standard photolithography techniques are used to pattern layers 304, 306, 308, and 310 into multilayer interconnection 312. First a photoresist layer is formed over second refractory metal layer 310. The photoresist layer is then masked, exposed, and developed to define a location where the interconnection layer 312 is to be formed. Next layers 304, 306, 308 and 310 are anisotropically dry etched to form a multilayer interconnection 312. In the preferred embodiment layers 304, 306, 308, and 310 are plasma etched together at one time with a plasma chemistry comprising $CCl_4$ and Ar. Next, an ILD 314, for example $SiO_2$, is deposited onto ILD 302 and interconnection 312. ILD 314 electrically isolates interconnection 312 or metal 1 from a subsequently formed interconnection layer or metal 2. It is to be appreciated that ILD 314 can comprise multiple insulating layers or composite layers of $SiO_2$, spin on glass (SOG), and silicon nitride, etc. Planarization techniques are generally used at this time to planarize the surface of ILD 314.

Next, a sacrificial layer 313 is formed over ILD 314. Sacrificial layer 313 is used to form a high surface area contact between a via and an interconnection formed above. Sacrificial layer 314 is formed to a thickness equal to the distance at which the via is to extend into the interconnection. The sacrificial layer 313 should be able to be selectively etched with respect to the material used to form ILD 314 and be selectively etched with respect to the metal to be used to form the via connection. A photoresist layer or a polyimide layer can be used as sacrificial layer 313. Such materials can be deposited with techniques well known in the art.

Figure 3C:
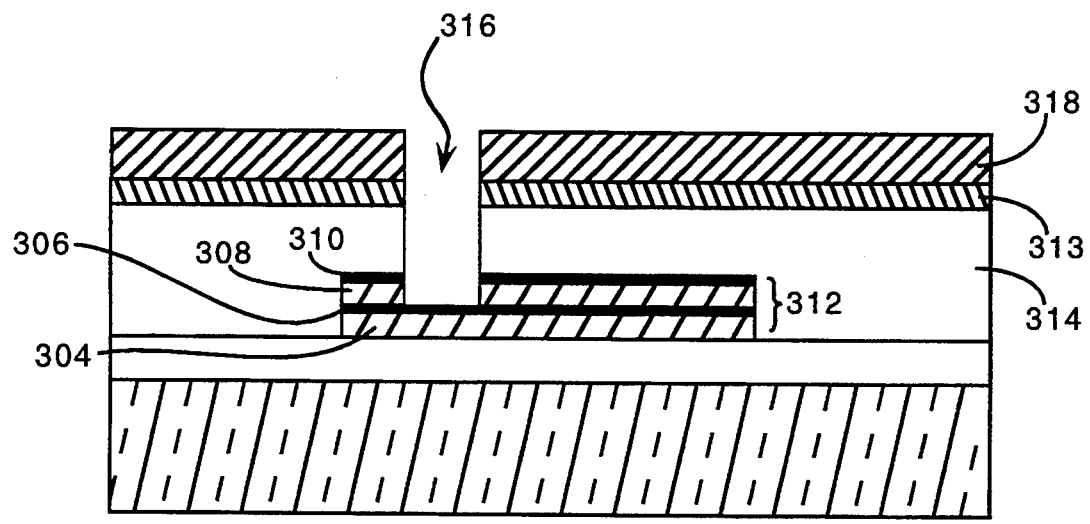
FIG. 3c is an illustration of a cross-sectional view showing the formation of a via hole in the substrate of FIG. 3b.

Next, via hole 316 is etched through sacrificial layer 313 and ILD 314, second refractory metal layer 310, and second aluminum alloy layer 308 so that electrical connection can be made between multilayer interconnection 312 and a subsequently formed metalization layer. As shown in FIG. 3c, a photoresist layer 318 is masked, exposed, and developed to define the location where the via hole 316 is to be formed. A dry anisotropic etch process is preferably used to form via hole 316 in the present invention. A dry anisotropic etch can form small dimensioned vias with vertical side walls which are compatible with high packing densities necessary for modern ULSI circuits. First a reactive ion etch with a chemistry comprising $CHF_3$ and $O_2$ is used to anisotropically etch via hole 316 through sacrificial layer 313 and ILD 314.

Once the second refractory metal layer 308 is reached, the first etch is stopped and a new etch chemistry is then introduced to anisotropically etch refractory metal layer 310 and aluminum alloy layer 308. A reactive ion etch with a chemistry comprising $BCl_3$, $CCl_4$, and $Cl_2$ can be used. The etch is continued until the first refractory metal layer 306 is reached. First refractory metal layer 306 can (depending upon the actual etch chemistry utilized) act either as an etch-stop for the etch or provide end point detection means by allowing the monitoring of the change in etch by-products. Having an etch stop or endpoint detection capabilities allows overetching to be used, which guarantees via hole uniformity across the wafer and from wafer to wafer. This feature makes the present process extremely manufacturable.

It is to be appreciated that the depth at which via hole 316 is etched into multilayer interconnection 312 can be varied as desired. This allows control over the resistance of the via by controlling the interfacial surface area between multilayer interconnection 312 and the subsequently formed via. It is to be appreciated that the via hole 316 should be formed through the second aluminum alloy layer to at least the first refractory metal layer in order to preserve the redundancy of the interconnection structure. Via hole 316 can, if desired, be formed at varying depths into the first aluminum alloy layer 304. Etching to the first refractory metal layer 306 is preferred because the first refractory metal layer 306 provides either an etch stop or end point detection capabilities.

Figure 3D:
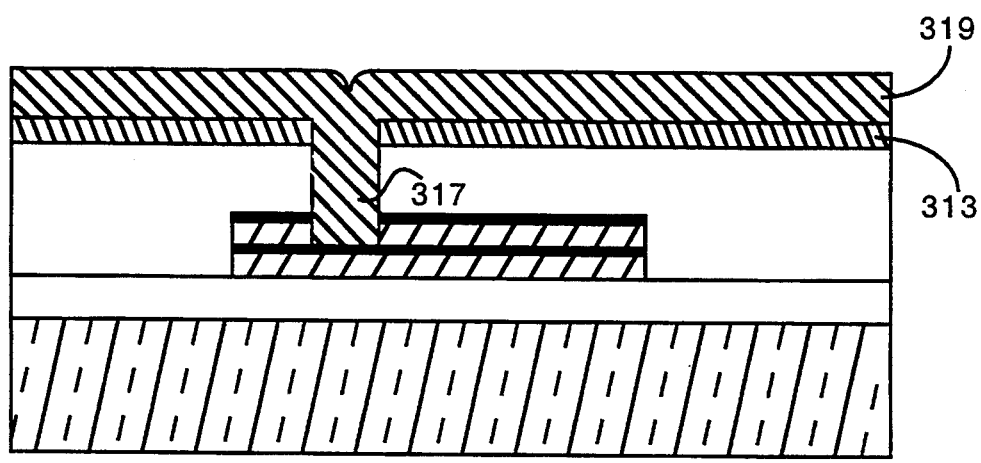
FIG. 3d is an illustration of a cross-sectional view showing the filling of the via hole with a conductive material on the substrate of FIG. 3c.

Once via 316 has been etched to the desired depth, photoresist layer 318 is removed with well-known techniques. Next, as shown in FIG. 3d, a conformal layer of tungsten 319 is blanket deposited over sacrificial layer 313 and into via hole 316. Via hole 316 is completely filled in the process to form a metalized via 317. The tungsten layer can be formed with well-known conventional chemical vapor deposition (CVD) technology. Tungsten layer 319 is then etched back by means of a dry etch using fluorine based chemistry. As an alternative, tungsten layer 319 can be etched back by means of well-known chemical-mechanical polishing techniques. It is to be appreciated that via hole 316 can be filled with other conductive materials, such as aluminum, polysilicon, copper or TiN.

Figure 3E:
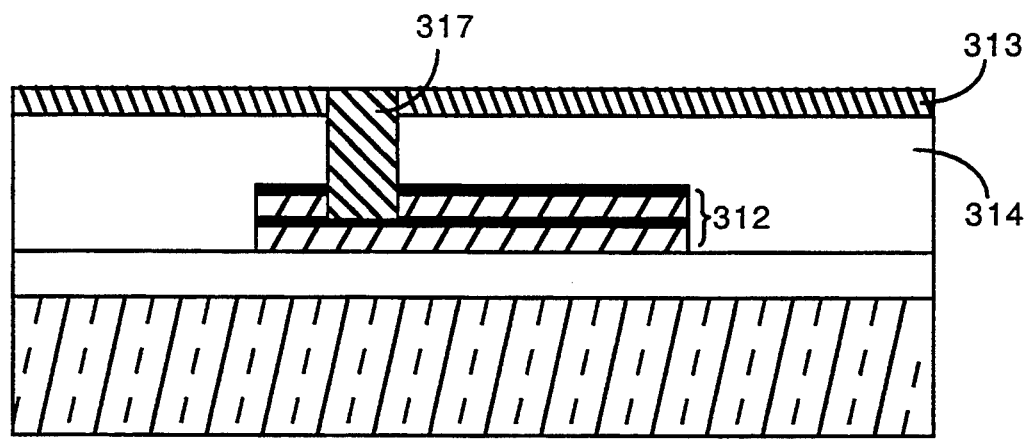
FIG. 3e is an illustration of a cross-sectional view showing the removal of the conductive material used to fill the via hole from the surface of the sacrificial layer on the substrate of FIG. 3d.
Figure 3F:
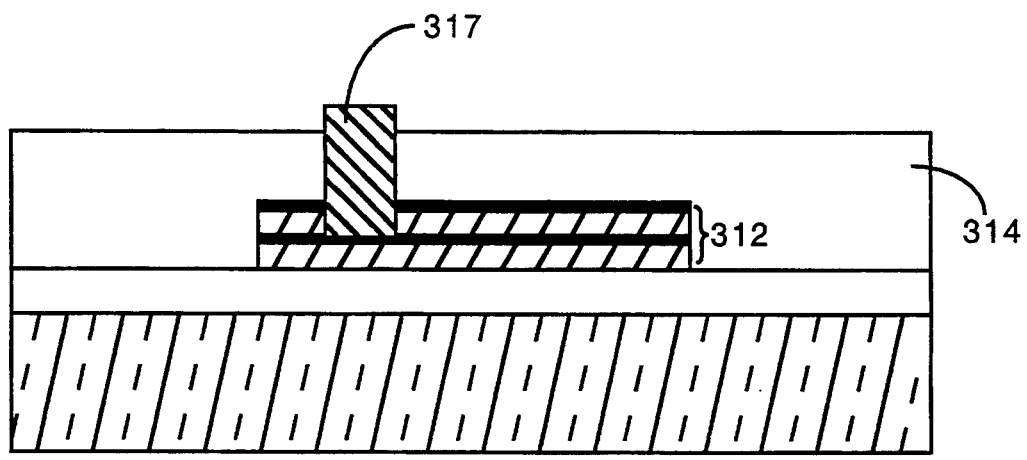
FIG. 3f is an illustration of a cross-sectional view showing the removal of the sacrificial layer from the substrate of FIG. 3e.

The result, as shown in FIG. 3e, is a high surface area tungsten plug or via 317 which is recessed into multilayer interconnection layer 312 and which is substantially planar with the top surface of sacrificial layer 313. It is to be appreciated that a slight dimple may form on top of filled via 317. Next, as shown in FIG. 3f, the sacrificial layer 313 is removed with techniques well known in the art. An etchant is chosen which can selectively etch sacrificial layer 313 without substantially etching either ILD 314 or via 317. As a result, metalized via 317 extends above ILD 314. The distance at which metalized via 317 extends above ILD 314 can be varied as desired by varying the thickness of sacrificial layer 313. In this way the contact area between via 317 and the subsequently formed second interconnection can be set as desired. This in turn allows the tailoring of the contact resistance.

Figure 3G:
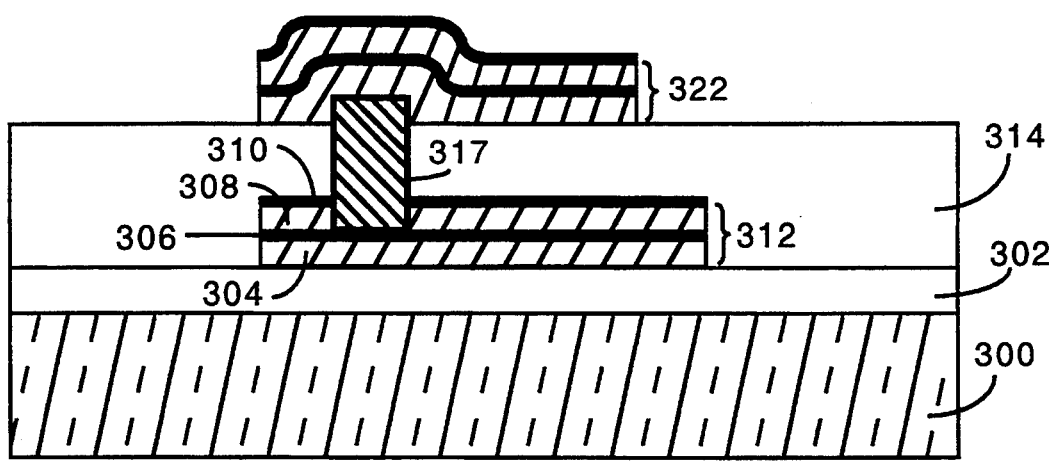
FIG. 3g is an illustration of a cross-sectional view showing the formation of a second interconnection on the second insulating layer and on and around the via of the substrate of FIG. 3e.

Next, as shown in FIG. 3g, a second level of metalization is formed. In the preferred embodiment of the present invention, the second level of metalization provides a multilayer interconnection 322 having a structure similar to that of multilayer interconnection 312. Interconnection 322 is formed in manner similar to that of multilayer interconnection 312. Multilayer interconnection 322 is formed over and around the portion of conductive via 317 which extends above ILD 314, thereby forming a high surface area contact with interconnection 322. It is to be appreciated that the contact area between interconnection 322 and conductive via 317 is dependent upon the amount which via 317 extends above ILD 314. This amount is determined by the thickness of sacrificial layer 313. Multilayer interconnection layer 322 is now in electrical contact with multilayer interconnection 312.

The preferred embodiment of the novel interconnection structure of the present invention is now complete. It is to be appreciated that described features of the present invention can be substituted, altered, or omitted without departing from the scope of the present invention For example, if desired, high surface area contacts may be made to only one interconnection and still obtain some reliability advantages. Additionally, different metals and/or stacking structures for the interconnections may also be used. It is also to be appreciated that the present invention is equally applicable to via connections made between higher levels of metalization (i.e., between metal 2 and metal 3, etc.) and is not to be limited to connections made between metal 1 and metal 2, as described Thus, a novel, reliable, low resistivity, high performance, high density interconnection structure for a multilevel integrated circuit has been described.

I claim:

1. A method of forming an interconnection structure for an integrated circuit comprising the steps of:
    forming a first interconnection on a first insulating layer of said integrated circuit wherein said step of forming said first interconnection comprises the steps of:
        forming a first layer comprising aluminum;
        forming a first refractory metal layer on said first layer;
        forming a second layer comprising aluminum on said first refractory metal layer;
        patterning said first layer, said first refractory metal layer, and said second layer into said first interconnection;
    forming a second insulating layer on said first interconnection;
    etching a via opening through said second insulating layer and partially into said first interconnection;
    filling said via opening with a conductive material to form a conductive via; and
    forming a second interconnection on said second insulating layer in electrical contact with said conductive via.

2. The method of claim 1 wherein said step of forming said first interconnection further comprises the step of forming a second refractory metal layer on said second layer, wherein said second refractory metal layer is patterned along with said first and second layers and said first refractory metal layer to form said first interconnection.

3. The method of claim 1 wherein said first refractory metal layer is selected from the group consisting of titanium, tungsten, tantalum, molybdenum, and titanium nitride.

4. The method of claim 1 wherein said conductive material is selected from the group consisting of aluminum, copper and tungsten.

5. The method of claim 1 wherein said via opening is filled by blanket depositing said conductive material into said via opening and onto said second insulating layer and then removing said conductive material from said second insulating layer.

6. The method of claim 5 wherein said conductive material is removed from said second insulating layer by reactive ion etching.

7. The method of claim 5 wherein said conductive material is removed from said second insulating layer by chemical-mechanical polishing.

8. The method of claim 1 wherein said step of forming said second interconnection comprises the steps of:
   forming a third layer comprising aluminum;
   forming a third refractory metal layer on said third layer;
   forming a fourth layer comprising aluminum on said third refractory metal layer; and patterning said third layer, said third refractory metal layer, and said fourth layer into said second interconnection.

9. The method of claim 1 wherein said via opening is etched through said second layer to said first refractory metal layer.

* * * * *

UNITED STATES PATENT AND TRADEMARK OFFICE
CERTIFICATE OF CORRECTION

PATENT NO. : 5,444,022
DATED : August 22, 1995
INVENTOR(S) : Donald S. Gardner

It is certified that error appears in the above-indentified patent and that said Letters Patent is hereby corrected as shown below:

In column 5 at line 61 delete "(TIN)" and insert --(TiN)--

Signed and Sealed this

Twenty-fourth Day of December, 1996

Attest:

BRUCE LEHMAN

*Attesting Officer*  *Commissioner of Patents and Trademarks*